United States Patent
Wang (10) Patent No.: US 7,879,738 B2
(45) Date of Patent: Feb. 1, 2011

(54) CHARGE TRAPPING DIELECTRIC STRUCTURE FOR NON-VOLATILE MEMORY

(75) Inventor: Szu Yu Wang, Kaoshing (TW)

(73) Assignee: Macronix International Co., Ltd., Hsinchu (TW)

( * ) Notice: Subject to any disclaimer, the term of this patent is extended or adjusted under 35 U.S.C. 154(b) by 387 days.

(21) Appl. No.: 11/466,079

(22) Filed: Aug. 21, 2006

(65) Prior Publication Data

US 2006/0281331 A1 Dec. 14, 2006

Related U.S. Application Data

(62) Division of application No. 10/998,445, filed on Nov. 29, 2004, now abandoned.

(51) Int. Cl.
H01L 21/469 (2006.01)
(52) U.S. Cl. ............... 438/778; 438/90; 257/E29.309; 257/E29.316; 257/E21.018
(58) Field of Classification Search .......... 257/640, 257/649, 324, 316, 325, 639, 410, 321; 438/261, 438/778
See application file for complete search history.

(56) References Cited

U.S. PATENT DOCUMENTS

| | | | |
|---|---|---|---|
| 4,959,812 A | 9/1990 | Momodomi et al. |
| 5,270,969 A | 12/1993 | Iwahashi |
| 5,278,439 A | 1/1994 | Ma et al. |
| 5,355,464 A | 10/1994 | Fandrich et al. |
| 5,408,115 A | 4/1995 | Chang |
| 5,424,569 A | 6/1995 | Prall |
| 5,428,568 A | 6/1995 | Kobayashi et al. |
| 5,448,517 A | 9/1995 | Iwahashi |
| 5,483,486 A | 1/1996 | Javanifard et al. |
| 5,485,422 A | 1/1996 | Bauer et al. |
| 5,509,134 A | 4/1996 | Fandrich et al. |

(Continued)

FOREIGN PATENT DOCUMENTS

JP 09162313 A 6/1997

(Continued)

OTHER PUBLICATIONS

Yeh, C.C., et al., "Novel Operation Schemes to Improve Device Reliability in a Localized Trapping Storage SONOS-type Flash Memory," 0-7803-7872, IEEE, 2003, pp. 7.5.1-7.5.4.

(Continued)

*Primary Examiner*—Thanh V Pham
*Assistant Examiner*—Mark A Laurenzi, III
(74) *Attorney, Agent, or Firm*—Kenta Suzue; Haynes Beffel & Wolfeld LLP (57) ABSTRACT

An integrated circuit structure comprises a bottom dielectric layer on a substrate, a middle dielectric layer, and a top dielectric layer. The middle dielectric layer has a top surface and a bottom surface, and comprises a plurality of materials. Respective concentration profiles for at least two of the plurality of materials between the top and bottom surfaces are non-uniform and arranged to induce a variation in energy gap between the top and bottom surfaces. The variation in energy gap establishes an electric field between the top and bottom surfaces tending to oppose charge motion toward at least one of the top and bottom surfaces and prevent resultant charge leakage.

4 Claims, 5 Drawing Sheets

U.S. PATENT DOCUMENTS

| | | | |
|---|---|---|---|
| 5,515,324 | A | 5/1996 | Tanaka |
| 5,566,120 | A | 10/1996 | D'Souza |
| 5,602,775 | A | 2/1997 | Vo |
| 5,602,789 | A | 2/1997 | Endoh et al. |
| 5,644,533 | A | 7/1997 | Lancaster et al. |
| 5,694,356 | A | 12/1997 | Wong et al. |
| 5,745,410 | A | 4/1998 | Yiu et al. |
| 5,768,192 | A | 6/1998 | Eitan |
| RE35,838 | E | 7/1998 | Momodomi et al. |
| 5,895,949 | A | 4/1999 | Endoh et al. |
| 5,907,183 | A * | 5/1999 | Takeuchi ............... 257/640 |
| 5,966,603 | A | 10/1999 | Eitan |
| 6,001,694 | A * | 12/1999 | Shih et al. ............ 438/287 |
| 6,011,725 | A | 1/2000 | Eitan |
| 6,023,423 | A | 2/2000 | Aritome |
| 6,034,896 | A | 3/2000 | Ranaweera et al. |
| 6,067,251 | A | 5/2000 | Hirano |
| 6,074,917 | A | 6/2000 | Chang et al. |
| 6,075,727 | A | 6/2000 | Morton et al. |
| 6,087,229 | A | 7/2000 | Aronowitz et al. |
| 6,096,603 | A | 8/2000 | Chang et al. |
| 6,172,907 | B1 | 1/2001 | Jenne |
| 6,194,272 | B1 | 2/2001 | Sung |
| 6,215,148 | B1 | 4/2001 | Eitan |
| 6,219,276 | B1 | 4/2001 | Parker |
| 6,297,096 | B1 | 10/2001 | Boaz |
| 6,320,786 | B1 | 11/2001 | Chang et al. |
| 6,363,013 | B1 | 3/2002 | Lu et al. |
| 6,396,741 | B1 | 5/2002 | Bloom et al. |
| 6,403,975 | B1 | 6/2002 | Brunner et al. |
| 6,436,768 | B1 | 8/2002 | Yang et al. |
| 6,445,617 | B1 | 9/2002 | Sakakibara |
| 6,458,642 | B1 | 10/2002 | Yeh et al. |
| 6,479,862 | B1 * | 11/2002 | King et al. ............ 257/321 |
| 6,487,114 | B2 | 11/2002 | Jong et al. |
| 6,496,417 | B1 | 12/2002 | Shiau et al. |
| 6,512,696 | B1 | 1/2003 | Fan et al. |
| 6,538,923 | B1 | 3/2003 | Parker |
| 6,551,948 | B2 | 4/2003 | Ohmi et al. |
| 6,552,386 | B1 | 4/2003 | Wu |
| 6,556,481 | B1 | 4/2003 | Hsu et al. |
| 6,566,699 | B2 | 5/2003 | Eitan |
| 6,587,903 | B2 | 7/2003 | Roohparvar |
| 6,614,070 | B1 | 9/2003 | Hirose et al. |
| 6,614,694 | B1 | 9/2003 | Yeh et al. |
| 6,643,181 | B2 | 11/2003 | Sofer et al. |
| 6,643,185 | B1 | 11/2003 | Wang et al. |
| 6,646,924 | B1 | 11/2003 | Tsai et al. |
| 6,657,894 | B2 | 12/2003 | Yeh et al. |
| 6,670,240 | B2 | 12/2003 | Ogura et al. |
| 6,670,671 | B2 | 12/2003 | Sasago et al. |
| 6,683,811 | B2 | 1/2004 | Ishii et al. |
| 6,690,601 | B2 | 2/2004 | Yeh et al. |
| 6,714,457 | B1 | 3/2004 | Hsu et al. |
| 6,721,204 | B1 | 4/2004 | Yeh et al. |
| 6,727,134 | B1 | 4/2004 | Chen et al. |
| 6,730,992 | B2 | 5/2004 | Sakama et al. |
| 6,756,646 | B2 | 6/2004 | Buchanan et al. |
| 6,774,462 | B2 | 8/2004 | Tanaka et al. |
| 6,818,558 | B1 | 11/2004 | Rathor et al. |
| 6,829,175 | B2 | 12/2004 | Tsai et al. |
| 6,834,012 | B1 | 12/2004 | He et al. |
| 6,836,435 | B2 | 12/2004 | Li |
| 6,912,163 | B2 | 6/2005 | Zheng et al. |
| 6,937,511 | B2 | 8/2005 | Hsu et al. |
| 2002/0167844 | A1 | 11/2002 | Han et al. |
| 2002/0179958 | A1 | 12/2002 | Kim |
| 2003/0003658 | A1 * | 1/2003 | Tseng et al. ............ 438/257 |
| 2003/0017670 | A1 * | 1/2003 | Luoh et al. ............ 438/257 |
| 2003/0036250 | A1 | 2/2003 | Lin et al. |
| 2003/0185055 | A1 | 10/2003 | Yeh et al. |
| 2004/0004245 | A1 * | 1/2004 | Forbes et al. ............ 257/315 |
| 2004/0007748 | A1 | 1/2004 | Sakama et al. |
| 2004/0084714 | A1 | 5/2004 | Ishii et al. |
| 2004/0145024 | A1 | 7/2004 | Chen et al. |
| 2004/0188753 | A1 * | 9/2004 | Kawashima et al. ...... 257/316 |
| 2005/0001258 | A1 | 1/2005 | Forbes |
| 2005/0067634 | A1 * | 3/2005 | Pinnow et al. ........... 257/202 |
| 2005/0237801 | A1 | 10/2005 | Shih |
| 2005/0237809 | A1 | 10/2005 | Shih et al. |
| 2005/0237813 | A1 | 10/2005 | Zous et al. |
| 2005/0237815 | A1 | 10/2005 | Lue et al. |
| 2005/0237816 | A1 | 10/2005 | Lue et al. |
| 2005/0281085 | A1 | 12/2005 | Wu |
| 2006/0039219 | A1 | 2/2006 | Sofer et al. |
| 2006/0044934 | A1 | 3/2006 | Wong et al. |
| 2006/0050562 | A1 | 3/2006 | Cernea et al. |

FOREIGN PATENT DOCUMENTS

| | | |
|---|---|---|
| JP | 11233653 A | 8/1999 |
| WO | WO 94/28551 | 12/1994 |

OTHER PUBLICATIONS

De Blauwe, Jan, "Nanocrystal Nonvolatile Memory Devices," IEEE Transactions on Nanotechnology, vol. 1, No. 1, Mar. 2002. pp. 72-77.

Chung, Steve S. et al., "A Novel Leakage Current Separation Technique in a Direct Tunneling Regime," IEEE International, Dec. 8-10, 2003, pp. 26.6.1-28.6.4.

Chung, Steve S., "Low Voltage/Power and High Speed Flash Memory Technology or High Performance and Reliability," The 3rd WIMNTACT-Singapore, Oct. 15, 2003, pp. 1-48.

Janai, Meir, "Data Retention, Endurance and Acceleration Factors of NROM Devices," IEEE 03CH37400. 41st Annual International Reliability Physics Symposium, Dallas, Texas, 2003. pp. 502-505.

Lee, Changhyun, et al. "A Novel Structure of SIO2/SIN/High κ Dielectrics, AL2O3 for SONOS Type Flash Memory," Extended Abstracts of the 2002 International Conference on Solid State Devices and Materials, Nagoya, 2002, pp. 162-163.

Lee, Chang Hyun, "A Novel SONOS Structure of SiO2/SIN/Al2O3 with TaN Metal Gate for Multi-Giga Bit Flash Memories," IEEE, 0-7803-7873-3/03, 2003.

Lee, Jae-Duk, et al., "Effects of Floating-Gate Interference on NAND Flash Memory Cell Operation," IEEE Electron Device Letters, vol. 23, No. 5, May 2002, pp. 264-266.

Liu, Zhizheng et al., "A New Programming Technique for Flash Memory Devices," VLSI Technology, Systems and Applications, 1999, International Symposium on Jun. 8-10, 1999, pp. 195-198.

Lue, Hang-Ting et al., Application, "A Novel Soft Erase Method for 2bits/cell Nitride-Trapping Non-Volatile Memoey Devices with P-Poly Gate to achieve 10 MB/s Programming Throughput with Excellent Endurance and Retention, submitted for publication Jun. 24, 2004."

Pan, James et al., "Measuring the Work Functions of PVD TaN, TaSin and TiSIN Films With a Schottky Diode CV Technique for Metal Gate CMOS Applications," Materials Research Society Symp. Proc. vol. 745 2003, pp. N3.2.1-N3.2.6.

Shin, Yoocheol et al., "High Reliable SONOS-type NAND Flash memory Cell wityh AL2O3 for Top Oxide," Non-Volatile Semiconductor Memory Workshop, 2003, pp. 58-59.

Sugizaki, T. et al., "Novel Multi-bit SONOS Type Flash Memory Using a High-κ Charge Trapping Layer," VLSI Technology Digest of Technical Papers, 2003, pp. 27-28.

White, Marvin H. et al., "On the Go With Sonos," IEEE 8755-3996/00, Jul. 2000.

Wrazian, Stephen J. et al. "Characterization of SONOS oxynitride nonvolatile semiconductor memory devices," Solid State Electronics 47, 2003, pp. 885-891.

Bude, J.D., et al. "Secondary Electron Flash—a High Performance, Low Power Flash Technology for 0.35 •m and Below," Electron Devices Meeting, 1997. Technical Digest., International, Dec. 7-10, 1997, 279-282.

Eitan, Boaz, et al. "NROM: A Novel Localized Trapping, 2-Bit Nonvolatile Memory Cell," IEEE Electron Device Letters, vol. 21, No. 11, Nov. 2000, 543-545.

Hirose, M., "Challenges for Future Semiconductor Development," Microprocesses and Nanotechnology Conference, 2002. Digest of Papers. Microprocesses and Nanotechnology 2002. 2002 International, Nov. 6-8, 2002, p. 2-3, plus 24 pages from outline.

Huff, H.R. and Bevan, M., assemblers, "Questions at the International Workshop on Gate Insulators," Ad Hoc Meeting on High-κ Gate Dielectrics at the Semiconductor Interface Specialists Conference, Nov. 30, 2001, 3 pages.

Tsai, W.J., et al., "Data Retention Behavior of a SONOS Type Two-Bit Storage Flash Memory Cell," Electron Devices Meeting, 2001. IEDM Technical Digest. International, Dec. 2-5, 2001 pp. 32.6.1-32.6.4.

Wang, Tahui, et al., "Reliability Models of Data Retention and Read-Disturb in 2-bit Nitride Storage Flash Memory Cells," Electron Devices Meeting, 2003. IEDM '03 Technical Digest. IEEE International, Dec. 8-10, 2003, pp. 7.4.1-7.4.4.

Yeh, C.C., et al., "PHINES: A Novel Low Power Program/Erase, Small Pitch, 2-Bit per Cell Flash Memory," Electron Devices Meeting, 2002. IEDM '02. Digest. International, Dec. 8-11, 2002, pp. 931-934.

Chang, Kuo-Tung, et al., "A New SONOS Memory Using Source-Side Injection for Programming," IEEE Electron Device Letters, vol. 19, No. 7, Jul. 1998, 253-255.

Eitan, Boaz, "Can NROM, a 2-bit, Trapping Storage NVM Cell, Give a Real Challenge to Floating Gate Cells?" SSDM, Tokyo, Japan (1999), 3 pages.

Fujiwara, I., et al., "0.13 μm MONOS single transistor memory cell with separated source lines," IEDM 1998, 995-998.

Kobayashi, T., et al., A Giga-Scale Assist-Gate (AG)-AND-Type Flash Memory Cell with 20-MB/s Programming Throughput for Content-Downloading Applications, IEDM 2001, 2.2.1-2.2.4.

Lusky, Eli et al., "Electron Discharge Model of Locally-Trapped Charge in Oxide-Nitride-Oxide (ONO) Gates for NROM Non-Volatile Semiconductor Memory Devices," SSDM, Tokyo, Japan (Sep. 2001), 2 pages.

Lusky, Eli et al., "Spatial characterization of Channel hot electron injection Utilizing subthreshold slope of the localized charge storage NROM memory device," Non-Volatile Semiconductor Memory Workshop, Monterey, CA (Aug. 2001) 2 pages.

Naruke, K., et al. "A new Flash-Erase EEPROM Cell with a Sidewall Select-Gate on its Source Side," Nonvolatile Semiconductor Memories: Technologies, design and application, C. Hu. Ed., New York, IEEE Press, 1991, Ch. 5, pp. 183-186.

Sasago, Y, et al., "90-nm-node multi-level AG-AND type flash memory with cell size of true 2 F2/bit and programming throughput of 10 MB/s," IEEE, 2003, 4 pages.

U.S. Appl. No. 11/118,839, filed Apr. 29, 2005, "Inversion Bit Line, Charge Trapping Non-Volatile Memory and Method of Operating Same," 34 pages.

U.S. Appl. No. 11/085,444, filed Mar. 21, 2005, entitled "Method for Manufacturing a Multiple-Gate Charge Trapping Non-Volatile Memory," 71 pages.

U.S. Appl. No. 10/855,286, filed May 26, 2004, entitled "NAND-Type Non-volatile Memory Cell and Method for Operating Same," 15 pages.

U.S. Appl. No. 11/085,458, filed Mar. 21, 2005, entitled "Charge Trapping Non-Volatile Memory and Method for Gate-by-Gate Erase for Same," 73 pages.

U.S. Appl. No. 11/085,325, filed Mar. 21, 2005, entitled "Memory Array Including Multiple-Gate Charge Trapping Non-Volatile Cells," 74 pages.

U.S. Appl. No. 11/085,326, filed Mar. 21, 2005, entitled "Charge Trapping Non-Volatile Memory With Two Trapping Locations Per Gate, and Method for Operating Same," 73 pages.

U.S. Appl. No. 11/085,300, filed Mar. 21, 2005, entitled "Charge Trapping Non-Volatile Memory and Method for Operating Same," 73 pages.

Shih et al. "A Novel 2bit/cell Nitride Storage Flash Memory with Greater Than 1M P/E-cycle Endurance" IEEE 2004, pp. 36.3.1-36.3.4.

Cho et al. "Simultaneous Hot-Hole Injection at Drain and Source for Efficient Erase and Excellent Endurance in SONOS Flash EEPROM Cells" IEEE Electron Device Letters, vol. 24, No. 4, Apr. 2003, pp. 260-262.

U.S. Appl. No. 10/289,866, filed Nov. 6, 2002, "Erasing Method for Non-Volatile Memory," 24 pp.

Taiwan patent Application No. 91120417, 2002.

Lahiri, S. K., "MNOS/Floating-Gate Charge Coupled Devices for High Density EEPROMS: A New Concept", Physics of Semiconductor Devices,Dec. 1997, pp. 951-956, vol. 3316, No. 2.

* cited by examiner

CHARGE TRAPPING DIELECTRIC STRUCTURE FOR NON-VOLATILE MEMORY

CROSS-REFERENCE TO RELATED APPLICATIONS

This application is a division of U.S. patent application Ser. No. 10/998,445 filed on 29 Nov. 2004, now abandoned.

BACKGROUND OF THE INVENTION

1. Field of the Invention

The present invention relates to charge trapping dielectric structures and to non-volatile memory based on such structures.

2. Description of Related Art

Electrically programmable and erasable non-volatile memory technologies based on charge storage structures known as EEPROM and flash memory are used in a variety of modern applications. A number of memory cell structures are used for EEPROM and flash memory. As the dimensions of integrated circuits shrink, greater interest is arising for memory cell structures based on charge trapping dielectric layers, because of the scalability and simplicity of the manufacturing processes. Memory cell structures based on charge trapping dielectric layers include structures known by the industry names NROM, SONOS, and PHINES, for example. These memory cell structures store data by trapping charge in a charge trapping dielectric layer, such as silicon nitride. As negative charge is trapped, the threshold voltage of the memory cell increases. The threshold voltage of the memory cell is reduced by removing negative charge from the charge trapping layer.

One problem associated with charge trapping structures used in non-volatile memory is data retention. For commercial products it is desirable for such devices to hold data for at least ten years without loss. However, leakage of trapped charge occurs in such devices due to defects in the materials which accumulate over long use, or which are inherent in the structures.

It is desirable to provide charge trapping structures for non-volatile memory with improved charge retention characteristics.

SUMMARY OF THE INVENTION

The present invention provides an integrated circuit structure and a method for manufacturing an integrated circuit structure that comprises a bottom dielectric layer on a substrate, a middle dielectric layer, and a top dielectric layer. The middle dielectric layer has a top surface and a bottom surface, and comprises a plurality of materials. Respective concentration profiles for at least two of the plurality of materials between the top and bottom surfaces are non-uniform and arranged to induce a variation in energy gap between the top and bottom surfaces. The variation in energy gap establishes an electric field between the top and bottom surfaces tending to oppose charge motion toward at least one of the top and bottom surfaces and prevent resultant charge leakage. In embodiments of the structure, the bottom dielectric layer and the top dielectric layer are characterized by respective energy gaps at the interfaces with the top and bottom surfaces of the middle dielectric layer that are greater than a maximum energy gap in the middle dielectric layer, and in some embodiments greater than the energy gap levels in the middle dielectric layer at such interfaces. Various embodiments of the integrated circuit structure provide for a variation in energy gap which includes a minimum energy gap spaced away from the top and bottom surfaces, such as in a central region of the middle dielectric layer, and maximum energy gaps near to both of the top and bottom surfaces. Other embodiments provide for variation in energy gap which includes a minimum energy gap near the top surface of the middle dielectric layer and a maximum energy gap near the bottom surface, or vice versa. In some embodiments, the variation in energy gap is substantially monotonically increasing from one to the other of the top and bottom surfaces.

The integrated circuit structure is used for example in non-volatile charge storage flash memory devices, where the middle dielectric layer acts as the charge storage layer. In yet other embodiments, an integrated circuit structure is used as an interpoly dielectric layer in a floating gate memory cell. Thus, embodiments of the technology described include unique memory cells incorporating the top, middle and bottom dielectric layers described above.

Materials suitable for the middle dielectric layer include a combination of silicon, oxygen and nitrogen, like silicon oxynitride $SiO_xN_y$, where x and y are variable. The materials are arranged for example so that the concentration in a first half of the middle dielectric layer near the top dielectric layer of material tending to decrease the energy gap (like nitrogen in a silicon oxynitride) is greater than the concentration of such material in a second half of the middle dielectric layer near the bottom dielectric layer, and so that the material tending to increase the energy gap (like oxygen in a silicon oxynitride) has a concentration that is lower in the first half of the middle dielectric layer near the top dielectric layer, and higher in a second half of the middle dielectric layer near the bottom dielectric layer. For example, for an embodiment comprising a combination of silicon, oxygen and nitrogen, the concentration of oxygen decreases from the bottom surface of the middle dielectric layer to the top surface of the middle dielectric layer, and the concentration of nitrogen increases from the bottom surface of the middle dielectric layer to the top surface. This structure opposes charge movement toward the bottom surface of the middle dielectric layer. In yet another embodiment, the materials are arranged so that the maximum energy gap is near the top surface of the middle dielectric layer and the minimum energy gap is near the bottom surface, to oppose charge movement towards the top surface. The materials can also be arranged to oppose charge movement towards both the top and bottom surfaces, by establishing a minimum energy gap in a central region of the middle dielectric layer, with maximums near both the top and bottom surfaces.

Methods for manufacturing a middle dielectric layer for the structures described herein include depositing a sequence of thin films having varying concentrations of materials and/or varying combinations of materials using techniques like atomic layer deposition, chemical vapor deposition, and so on. In embodiments where the middle dielectric layer comprises silicon oxynitride, a method for manufacturing includes formation of a first film of silicon oxynitride with a nominal concentration of silicon, oxygen and nitrogen, followed by exposing the first film to nitrogen in a manner that causes incorporation of nitrogen into the structure near the top surface of the middle dielectric layer. The resulting structure can be annealed to smooth out the concentration profiles. In another embodiment, where the middle dielectric layer comprises silicon oxynitride, a method for manufacturing includes forming a first film of silicon oxynitride on the bottom dielectric, and forming a film of silicon nitride on the first film, followed by annealing the first and second films to smooth out the transition between the silicon oxynitride and the silicon nitride.

Other aspects and advantages of the present invention can be seen on review of the drawings, the detailed description and the claims, which follow.

DETAILED DESCRIPTION

A detailed description of embodiments of the present invention is provided with reference to the FIGS. 1-9.

Figure 1:
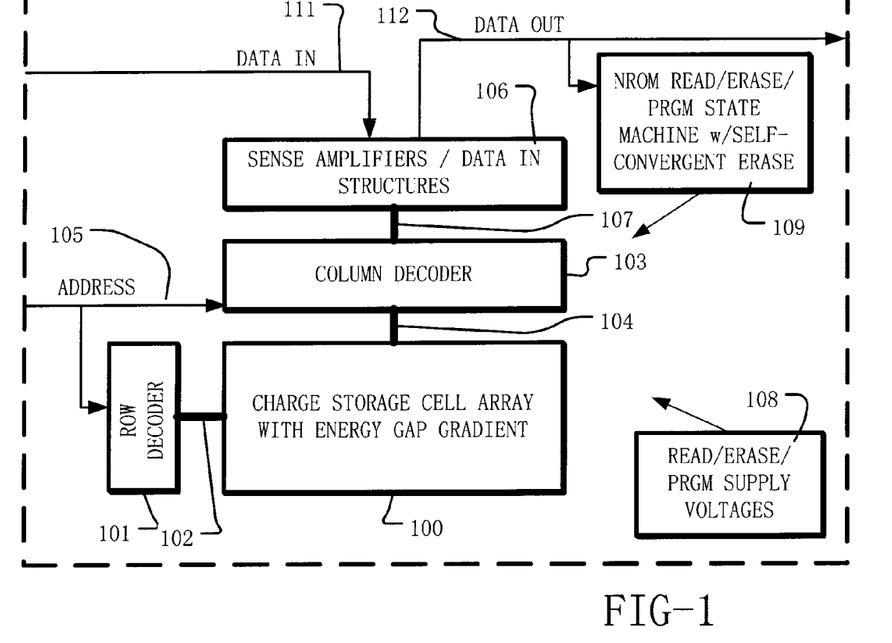
FIG. 1 is a simplified diagram of an integrated circuit including a charge storage memory cell array, where the memory cells have a dielectric layer with an energy gap gradient to oppose charge leakage.

FIG. 1 is a simplified block diagram of an integrated circuit including charge storage memory cells. The integrated circuit includes a memory array 100 implemented using charge trapping memory cells having a charge trapping dielectric structure with an energy gap gradient. An alternative includes a floating gate memory cell with an interpoly dielectric structure including a middle dielectric layer with an energy gap gradient. The energy gap gradient establishes a weak electric field at equilibrium, opposing charge leakage, and improves charge retention and durability of the memory device. A page/row decoder 101 is coupled to a plurality of word lines 102 arranged along rows in the memory array 100. A column decoder 103 is coupled to a plurality of bit lines 104 arranged along columns in the memory array 100. Addresses are supplied on bus 105 to column decoder 103 and page/row decoder 101. Sense amplifiers and data-in structures in block 106 are coupled to the column decoder 103 via data bus 107. Data is supplied via the data-in line 11 from input/output ports on the integrated circuit to the data-in structures in block 106. Data is supplied via the data-out line 112 from the sense amplifiers in block 106 to input/output ports on the integrated circuit.

Resources for controlling the reading, programming and erasing of memory cells in the array 100 are included on the chip. These resources include read/erase/program supply voltage sources represented by block 108, and the state machine 109, which are coupled to the array 100, the decoders 101, 103 and other circuitry on the integrated circuit, which participates in operation of the device.

The supply voltage sources (block 108) are implemented in various embodiments using charge pumps, voltage regulators, voltage dividers and the like as known in the art, for supplying various voltage levels, including negative voltages, used in the read, erase and program operations.

The state machine 109 supports read, erase and program operations. The state machine 109 can be implemented using special-purpose logic circuitry as known in the art. In alternative embodiments, the controller comprises a general-purpose processor, which may be implemented on the same integrated circuit, which executes a computer program to control the operations of the device. In yet other embodiments, a combination of special-purpose logic circuitry and a general-purpose processor may be utilized for implementation of the state machine.

Figure 2:
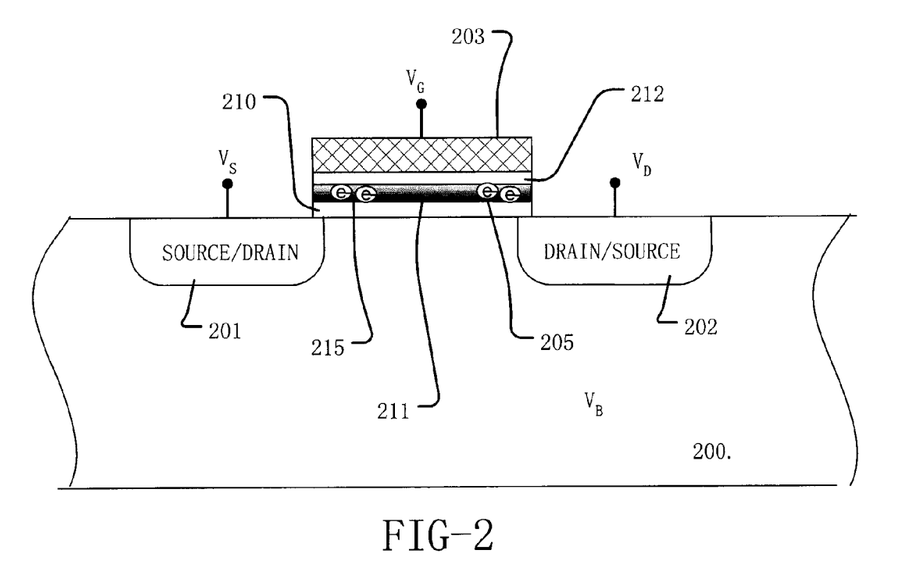
FIG. 2 is a simplified diagram of a charge trapping memory cell including a dielectric layer with an energy gap gradient to oppose charge leakage.

FIG. 2 is a simplified diagram of a charge trapping memory cell having a charge trapping dielectric layer with an energy gap gradient suitable for use in an integrated circuit as shown in FIG. 1. The memory cell is implemented in a semiconductor substrate 200. The cell includes a source/drain 201 and a drain/source 202 formed by respective diffusion regions, separated by a channel in the substrate 200. A gate 203 overlies the channel. Channel lengths in representative embodiments can be 0.25 microns and less, as minimum feature sizes scale downward in integrated circuit manufacturing. A charge storage element comprising middle dielectric layer 211 is isolated by a bottom dielectric layer 210 comprising an insulator such as silicon dioxide or silicon oxynitride between a region in the substrate 200 including the channel of the memory cell, and the middle dielectric layer 211, and by a top dielectric layer 212 between the gate 203 and the middle dielectric layer 211. The top and bottom dielectric layers typically have a thickness in the range of 30 to above 120 Angstroms depending on the operating arrangement selected, although other dielectric dimensions are applied for some memory cell embodiments.

The middle dielectric layer 211 in this example comprises a combination of materials including silicon, nitrogen and oxygen which make up a silicon oxynitride structure in which the concentrations of nitrogen and oxygen vary across the thickness of the element between the top and bottom dielectrics 210 and 212. In other embodiments, other charge trapping compositions, such as $Al_2O_3$, $HfO_x$, $ZrO_x$, or other metal oxides can be used to form memory cells with variations in concentrations of materials which create an energy gap gradient. The charge trapping layer can be continuous across the length of the channel as shown, or can consist of multiple isolated pockets of charge trapping material. Negative charge symbolized by charge traps 205, 215 is trapped in the charge trapping layer, in response to hot electron injection, Fowler-Nordheim tunneling, and/or direct tunneling in various program procedures.

Materials used for the dielectric layers 210, 211 and 212 may be formed using standard thermal silicon dioxide growth processes, in situ steam generation ISSG processes, along with or followed by nitridation by exposure to NO or $N_2O$, by chemical vapor deposition CVD, by plasma enhanced chemical vapor deposition PECVD, by tetraethoxysilane TEOS CVD, by high-density plasma chemical vapor deposition HPCVD, and other processes. Also, the materials can be formed by applying sputtering, pulsed vapor deposition PVD, jet vapor deposition JVD, and atomic layer deposition ALD. For background information about various possible deposition technologies, see, Rossnagel, S. M.; et al.; "From PVD to CVD to ALD for interconnects and related applications," Interconnect Technology Conference, 2001. Proceedings of the IEEE 2001 International, 4-6 Jun. 2001 Page(s): 3-5; Jelinek, M.; et al.; "Hybrid PLD technique for nitrogen rich CN, layers," Lasers and Electro-Optics Europe, 2000, Conference Digest 2000, Conference on 10-15 Sep. 2000. Page 1; and Wang, X, W.; et al.; "Ultra-thin silicon nitride films on Si by jet vapor deposition," VLSI Technology, Systems, and Applications, 1995. Proceedings of Technical Papers., 1995 International Symposium on, 31 May-2 Jun. 1995, Page(s): 49-52.

Figure 3:
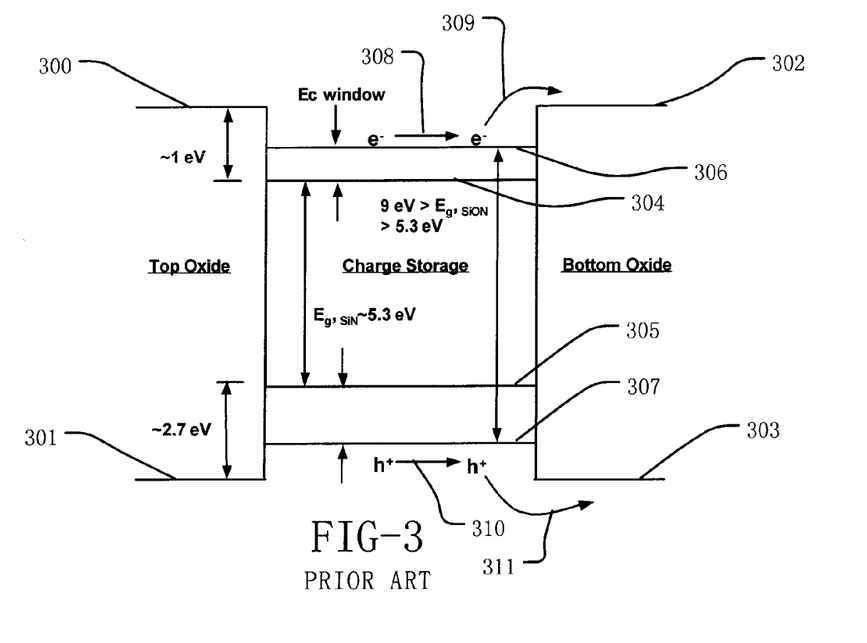
FIG. 3 is a simplified energy gap diagram for a prior art charge trapping dielectric structure.

FIG. 3 is a simplified energy level diagram for an equilibrium state of a prior art charge storage structure which includes a top layer comprising silicon dioxide (top oxide) and a bottom layer comprising silicon dioxide (bottom oxide). The charge storage layer in the illustrated example is silicon nitride or silicon oxynitride having an essentially uniform composition across the width of the layer. Thus, the conduction band 300 and the valence band 301 for the top oxide are separated by about 9 eV. Likewise, the conduction band 302 and the valence band 303 for the bottom oxide are separated by about 9 eV. The charge storage layer is designed so that its energy gap between the valence and conduction bands is less than that for the top oxide, and so that its energy gap between the valence and conduction bands is less than that for the bottom oxide. For an embodiment in which the charge storage layer comprises pure silicon nitride, the energy gap will be about 5.3 electron volt eV (conduction band 304 and valence band 305). The energy level for the conduction band 304 for SiN is about 1 eV lower than that for pure silicon dioxide, as is used in the top oxide and bottom oxide in this example. The energy level for the valence band 305 for SiN is about 2.7 eV lower (holes have opposite polarity) than that for pure silicon dioxide, as is used in the top oxide and bottom oxide in this example. For embodiments in which the charge storage layer comprises silicon oxynitride $SiO_xN_y$, the energy gap varies with the concentrations of oxygen and nitrogen between a level less than the energy gap of pure silicon dioxide (9 eV) and a level greater than the energy gap of pure silicon nitride (5.3 eV). Thus, a silicon oxynitride charge trapping layer will have a conduction band 306 and a valance band 307, separated by an energy gap of for one example, 7 eV. One mechanism for charge loss involves electrons (e–) that are excited from traps to the conduction band 306, and move along the flat energy level (arrow 308) of the conduction band to the interface with the bottom oxide, where they are able to jump (arrow 309) to the higher level conduction band of the bottom oxide, and conduct to the substrate. Another mechanism for charge loss involves holes (h+) that are excited from traps to the valence band 307, and move along the flat energy level (arrow 310) of the valence band to the interface with the bottom oxide, where they are able to jump (arrow 311) to the lower level conduction band of the bottom oxide, and conduct to the substrate.

Figure 4:
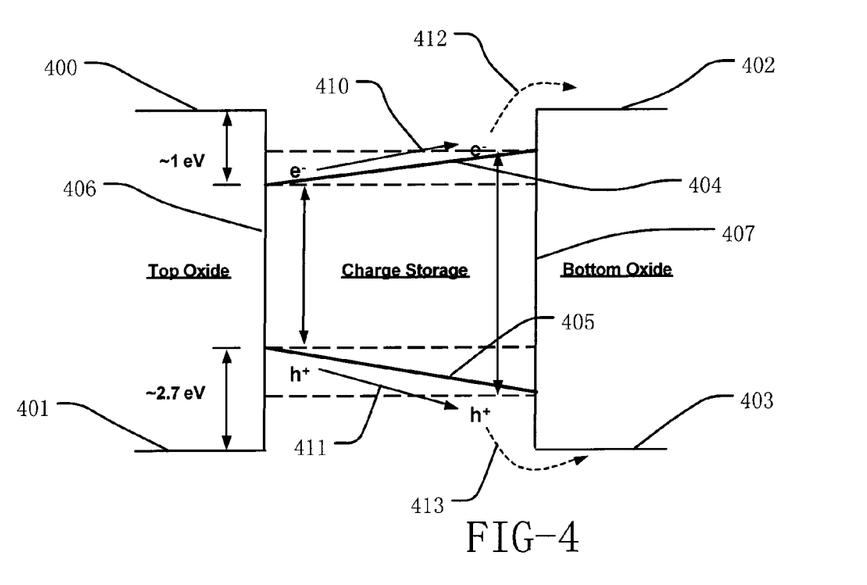
FIG. 4 is a simplified energy gap diagram for a charge trapping dielectric structure, including a middle dielectric layer with an energy gap gradient to oppose charge leakage.

FIG. 4 is a simplified energy level diagram for an equilibrium state of a charge storage structure having an energy gap gradient. Although other dielectrics can be utilized, the structure in the illustrated embodiment includes a top layer comprising silicon dioxide (top oxide) and a bottom layer comprising silicon dioxide (bottom oxide). The charge storage layer in the illustrated embodiment comprises silicon oxynitride having a varying concentrations of oxygen and nitrogen across the width of the layer. Thus, the conduction band 400 and the valence band 401 for the top oxide are separated by about 9 eV. Also, the conduction band 402 in the valence band 403 for the bottom oxide are separated by about 9 eV. The conduction band 404 and the valence band 405 in the charge storage layer are sloped, having an energy gap near the interface 406 with top oxide that is about 5.3 eV, or higher depending on the concentrations of materials at the interface, and having an energy gap near the interface 407 with the bottom oxide that is less than about 9 eV. Electrons (e–) that are excited to the conduction band 404 have to conduct (arrow 410) against the weak electric field that the gradient in energy gap creates before reaching the interface 407 with the bottom oxide, and are therefore less likely to escape. Likewise, holes (h+) which are excited to the valence band 405 have to conduct (arrow 411) against the weak electric field that the gradient in the energy gap creates before reaching the interface 407 with the bottom oxide. Thus, both electrons and holes are less likely to contribute to leakage current represented by dotted arrows 412 and 413, by this mechanism.

Figure 5:
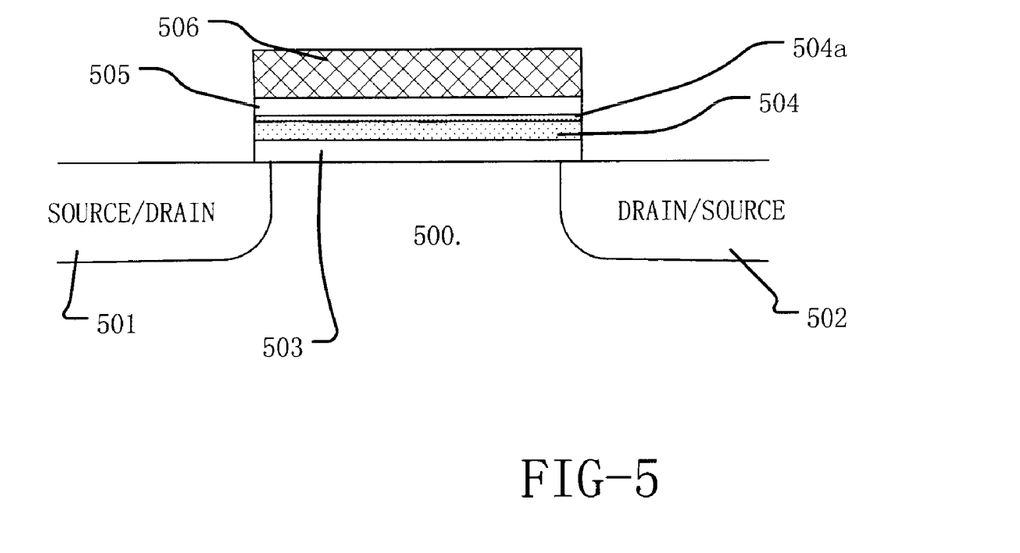
FIG. 5 is a simplified illustration for the purposes of describing a method for manufacturing a charge trapping dielectric structure, including a middle dielectric layer with an energy gap gradient to oppose charge leakage.

FIG. 5 illustrates one representative structure for implementing a charge storage memory cell with a charge storage layer with a gradient in energy gap. A memory cell including the charge storage layer comprises a source/drain region 501 and a drain/source region 502 which are separated by a channel region 500 in a semiconductor substrate. A charge storage structure comprises a first dielectric layer 503 (bottom dielectric), second dielectric layer including films 504 and 504a (charge storage layer), and a third dielectric layer 505 (top dielectric) under a gate 506. The first dielectric layer 503 is preferably a silicon dioxide layer, formed by thermal oxidation. Other embodiments include a nitrided silicon dioxide, or a silicon oxynitride material for the bottom dielectric. The film 504 is preferably a silicon oxynitride, formed by the deposition process so that the energy gap at the interface with the bottom dielectric is less than in the bottom dielectric. The film 504a having an increased concentration of nitrogen is formed using a nitridation treatment of the deposited silicon oxynitride material, such as a plasma nitridation process. Thermal treatment of the top surface of film 504 of the second dielectric layer in a nitrogen environment resulting in nitrogen incorporation can also be used to provide film 504a in a silicon oxynitride film 504. A thermal annealing process can be executed after the nitridation treatment to recover the plasma damage and make a more uniform slope in the distribution of materials in the charge storage layer. The thermal annealing temperature in range from 800° C. to 1100° C., with time range from 10 seconds to 120 seconds for rapid thermal process and 10 minutes to 1 hour for furnace thermal process are representative process parameters. The annealing ambient may include inert gas only or a combination of oxygen with the inert gas. The third dielectric is preferably a silicon dioxide layer, formed by thermal oxidation. Other embodiments include a nitrided silicon dioxide, or a silicon oxynitride material. The materials are chosen so that the energy gap in the charge storage layer (second dielectric) is less than that of the top oxide near the interface with the top oxide, and less than that of the bottom oxide near the interface with the bottom oxide. Also, the material concentrations vary through the charge storage layer to create a sloped conduction band, a sloped valance band, or both a sloped conduction band and a sloped valance band, which tends to establish a weak electric field opposing charge leakage. For example, the average concentration of nitrogen in the film 504a is greater than the average concentration of nitrogen film 504 of charge storage layer closest to the bottom oxide in the illustrated embodiment.

Figure 6:
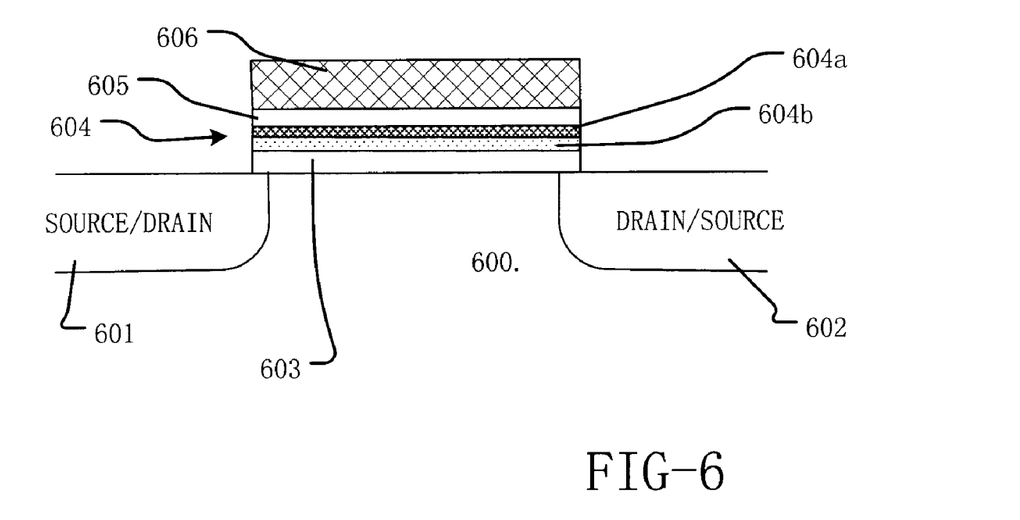
FIG. 6 is a simplified illustration for the purposes of describing another method for manufacturing a charge trapping dielectric structure, including a middle dielectric layer with an energy gap gradient to oppose charge leakage.

Another embodiment is shown in FIG. 6, which illustrates a structure for implementing a charge storage memory cell with a charge storage layer with a gradient in energy gap. A memory cell including the charge storage layer comprises a source/drain region 601 and a drain/source region 602 which are separated by a channel region 600 in a semiconductor substrate. A charge storage structure comprises a first dielectric layer 603 (bottom dielectric), a second dielectric layer 604 including films 604a and 604b (charge storage layer), and a third dielectric layer 605 (top dielectric) under a gate 606. The first dielectric layer 603 is preferably a silicon dioxide layer, formed by thermal oxidation. Other embodiments include a nitrided silicon dioxide, or a silicon oxynitride material for the bottom dielectric. The second dielectric layer 604 in this example comprises two films, 604a and 604b, that comprise different compounds. The second dielectric layer 604 comprises a deposited first film 604a of an oxynitride with band gap between 5.3 ev to 9 ev and a deposited second film 604b comprising a thin silicon nitride with band gap around 5.3 ev. Oxynitride film 604a in an alternative process is formed by a nitridation treatment on the surface of first dielectric 603, and the silicon nitride film 604b in an alternative process comprises one or more oxynitride films with different nitrogen and oxygen concentrations. In yet other embodiments, a plurality of films comprising silicon oxynitride with successively increasing concentrations of nitrogen as they are formed can be utilized. A thermal annealing process can be executed after the second dielectric formation to make a more uniform slope in the distributions of oxygen and nitrogen. The thermal annealing temperature preferably ranges from 800° C. to 1100° C., with a time range from 10 seconds to 120 seconds for rapid thermal process, and 10 minutes to 1 hour for furnace thermal process. The annealing ambient includes inert gas only or the addition of oxygen to the inert gas. The third dielectric layer 605 is preferably a silicon dioxide layer, formed by thermal oxidation. Other embodiments include a nitrided silicon dioxide, or a silicon oxynitride. The materials are chosen so that the energy gap in the charge storage layer (second dielectric) varies and is less than that of the top oxide at the interface with the top oxide, and less than that of the bottom oxide at the interface with the bottom oxide.

Figure 7:
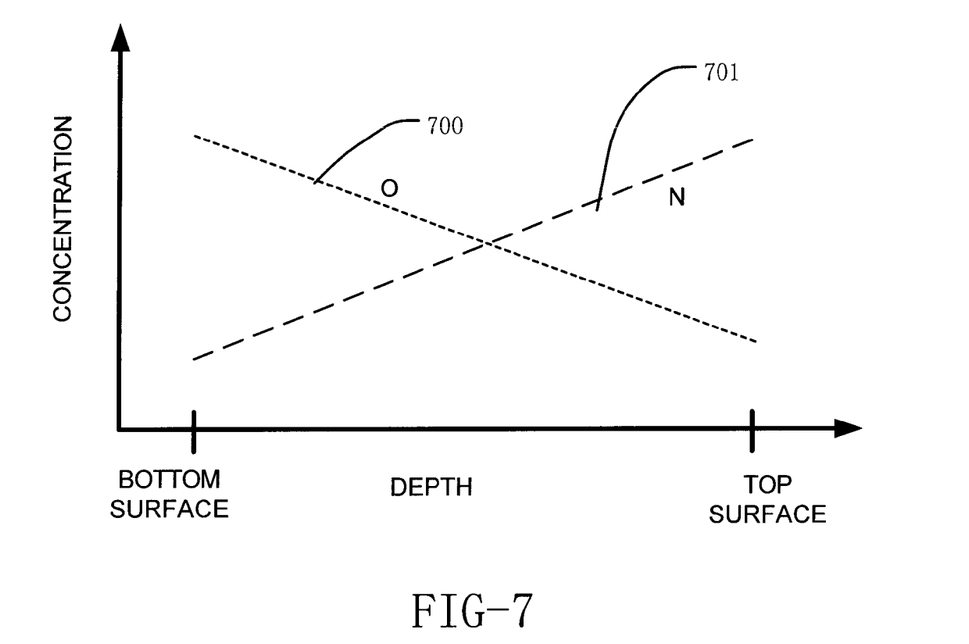
FIG. 7 is a graph of concentration of materials from a bottom surface to a top surface of a middle dielectric layer in a charge trapping dielectric structure for a simplified embodiment.

FIG. 7 illustrates heuristically the concentration profiles versus depth for oxygen on trace 700 and nitrogen on trace 701 for a charge storage structure such as that described above with respect to FIGS. 4-6, comprising silicon oxynitride. Although in an actual embodiment, the concentration profiles may not be so straight, and may not be monotonic, it is preferable that the concentration of nitrogen increase from a minimum near the bottom surface of the dielectric layer toward a maximum near the top surface, and that the concentration of oxygen decrease from a maximum near the bottom surface and a minimum near the top surface. It is recognized that there may be a buildup of nitrogen at the bottom interface depending on the method of manufacturing of the charge storage structure in the bottom of dielectric. However, the concentration distribution of nitrogen and oxygen can be controlled to overcome any effect of that build up, so that the effective structure has an energy gap gradient sufficient to oppose charge leakage at the bottom oxide interface.

Figure 8:
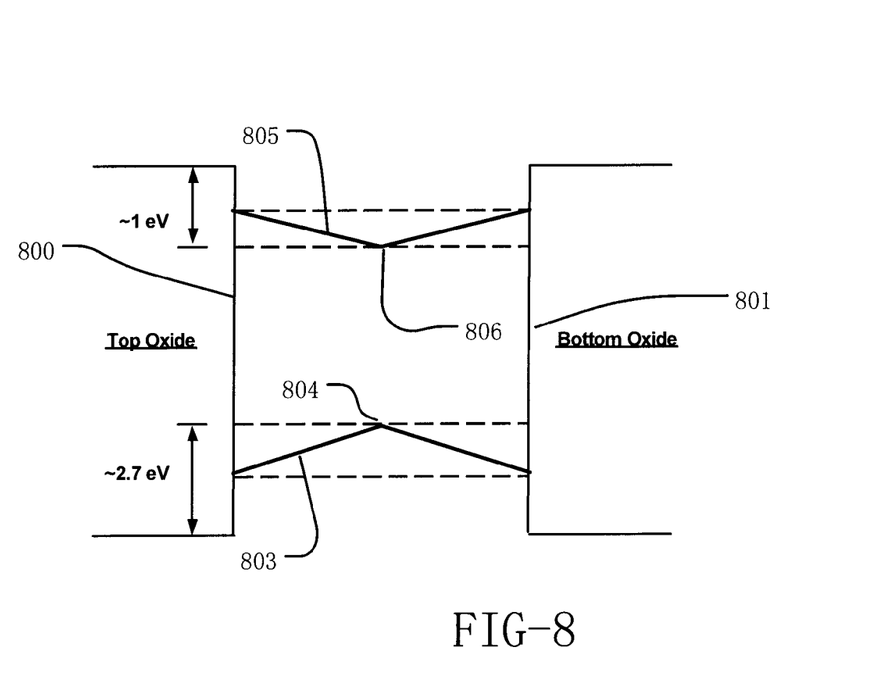
FIG. 8 is a simplified energy gap diagram for a charge trapping dielectric structure, including a middle dielectric layer with an energy gap minimum in a central region, and energy gap maximums near both the top and bottom surfaces, to oppose charge leakage.

FIG. 8 illustrates yet another embodiment of a memory cell, including a dielectric structure which is engineered to oppose charge leakage at both the interface 800 with the top dielectric and the interface 801 with the bottom dielectric. Thus, in the illustrated embodiment, the valence band 803 in the charge storage layer has a minimum energy gap at a point 804 near the middle of the layer, and respective maximum energy gaps on either side of the minimum energy gap, such as at or near the interface 800 with the top dielectric and at or near the interface 801 with the bottom dielectric. Likewise the conduction band 805 in the charge storage layer has a minimum energy gap at a point 806 near the middle of the layer, and respective maximum energy gaps on either side of the minimum energy gap, such as at or near the interface 800 with the top dielectric and at or near the interface 801 with the bottom dielectric. The structure can be implemented such that the respective maximum energy gaps are close to the same, or such that they are quite different, depending on the manufacturing techniques applied and the needs of the particular implementation. Such structure could be implemented for example by depositing a nitrogen rich silicon oxynitride film between two or more oxygen rich silicon oxynitride films to form the charge storage layer.

Figure 9:
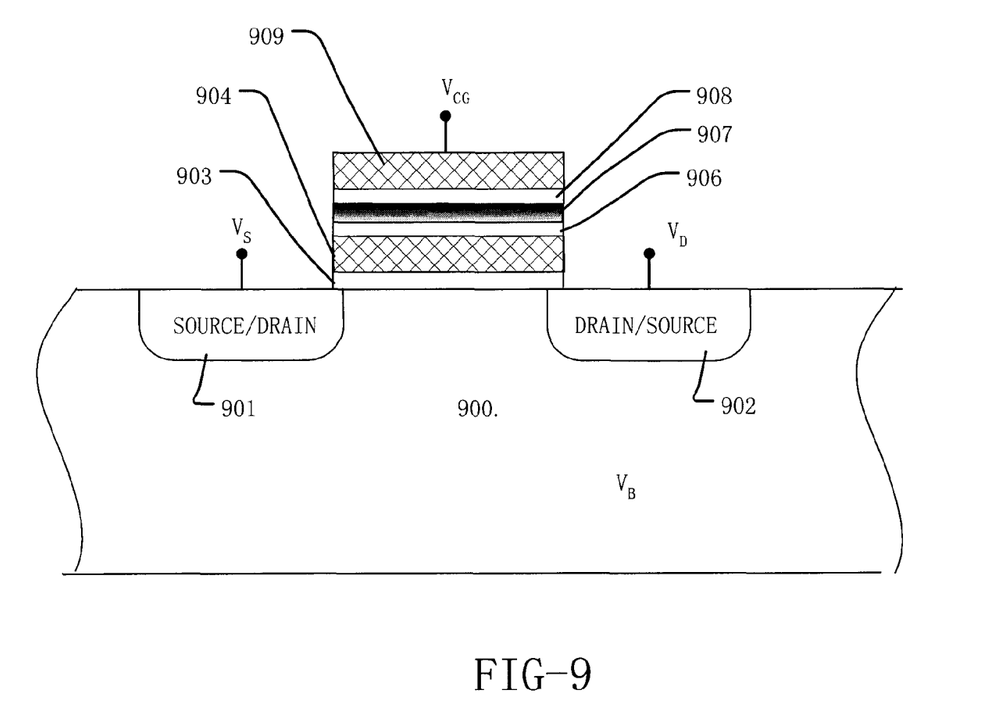
FIG. 9 is a simplified diagram of a floating gate memory cell including a dielectric layer with an energy gap gradient to oppose charge leakage.

FIG. 9 is a simplified diagram of a floating gate memory cell having an interpoly dielectric layer comprising a dielectric stack on the floating gate structure, including a bottom dielectric layer 906, a middle dielectric 907, with an energy gap gradient, and a top dielectric layer 908, where the energy gap gradient establishes a weak electric field at equilibrium that tends to oppose charge leakage from the floating gate 904 to the control gate 909. The memory cell is implemented in a semiconductor substrate 900. The cell includes a source/drain 901 and a drain/source 902 formed by respective diffusion regions, separated by a channel in the substrate 900. A control gate 909 overlies the channel. A floating gate 904 is isolated by a tunnel dielectric layer 903 from the channel. The interpoly dielectric comprises a bottom dielectric layer 906 on the floating gate 904, a middle dielectric layer 907 and a top dielectric layer 908. The substrate on which the bottom dielectric layer 906 rests is the floating gate polysilicon in is this embodiment. The top and bottom dielectric layers 908 and 906 comprise materials such as silicon dioxide or silicon oxynitride.

The middle dielectric layer 907 in this example comprises a combination of materials including silicon, nitrogen and oxygen which make up a silicon oxynitride structure in which the concentrations of nitrogen and oxygen vary across the thickness of the element between the top and bottom dielectric layers 907 and 906. The materials are arranged to establish an energy gap gradient that opposes charge leakage at the interface between the top dielectric layer 908, and the control gate 909. Other combinations of materials can be utilized as well, as discussed above.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. A method for manufacturing an integrated circuit structure including a substrate having a channel region at a surface of the substrate for a memory cell, comprising:

forming a bottom dielectric layer in contact with the channel region on the substrate;

forming a charge storage element consisting of a middle dielectric layer in contact with the bottom dielectric layer, the middle dielectric layer having a top surface and a bottom surface and comprising a plurality of materials with respective concentration profiles for at least two of the plurality of materials between the top and bottom surfaces that are non-uniform; and forming a top dielectric layer in contact with the middle dielectric layer, wherein the middle dielectric layer comprises silicon oxynitride, and wherein the concentration of oxygen is higher in a region near the interface with the bottom dielectric than near the interface with the top dielectric, and the concentration of nitrogen is higher in a region near the interface with the top dielectric than near the interface with the bottom dielectric, and wherein an energy gap of the middle dielectric layer decreases from (i) maximum energy gaps near the top and bottom surfaces of the middle dielectric layer, toward (ii) a middle of the middle dielectric layer.

2. A method for manufacturing an integrated circuit structure including a substrate having a channel region at a surface of the substrate for a memory cell, comprising:

forming a bottom dielectric layer in contact with the channel region on the substrate;

forming a charge storage element consisting of a middle dielectric layer in contact with the bottom dielectric layer, the middle dielectric layer having a top surface and a bottom surface and comprising a plurality of materials with respective concentration profiles for at least two of the plurality of materials between the top and bottom surfaces that are non-uniform; and forming a top dielectric layer in contact with the middle dielectric layer;

wherein the middle dielectric layer includes a first half near the top dielectric and a second half near the bottom dielectric, and wherein the concentration of a material tending to increase the energy gap is higher in one of the first and the second halves than in the other of the first and the second halves, and wherein an energy gap of the middle dielectric layer decreases from (i) maximum energy gaps near the top and bottom surfaces of the middle dielectric layer, toward (ii) a middle of the middle dielectric layer.

3. A method for manufacturing an integrated circuit structure including a substrate having a channel region at a surface of the substrate for a memory cell, comprising:

forming a bottom dielectric layer in contact with the channel region on the substrate;

forming a charge storage element consisting of a middle dielectric layer in contact with the bottom dielectric layer, the middle dielectric layer having a top surface and a bottom surface and comprising a plurality of materials with respective concentration profiles for at least two of the plurality of materials between the top and bottom surfaces that are non-uniform; and forming a top dielectric layer in contact with the middle dielectric layer;

wherein the middle dielectric layer includes a first half near the top dielectric and a second half near the bottom dielectric, and wherein the concentration of a material tending to decrease the energy gap is higher in one of the first and the second halves than in the other of the first and the second halves, and wherein an energy gap of the middle dielectric layer decreases from (i) maximum energy gaps near the top and bottom surfaces of the middle dielectric layer, toward (ii) a middle of the middle dielectric layer.

4. A method for manufacturing an integrated circuit structure including a substrate having a channel region at a surface of the substrate for a memory cell, comprising:

forming a bottom dielectric layer in contact with the channel region on the substrate;

forming a charge storage element consisting of a middle dielectric layer in contact with the bottom dielectric layer, the middle dielectric layer having a top surface and a bottom surface and comprising a plurality of materials with respective concentration profiles for at least two of the plurality of materials between the top and bottom surfaces that are non-uniform; and forming a top dielectric layer in contact with the middle dielectric layer;

wherein the middle dielectric layer comprises silicon oxynitride, wherein the concentration of nitrogen is higher in a region near the interface with the bottom dielectric than near the interface with the top dielectric, and the concentration of oxygen is higher in a region near the interface with the top dielectric than near the interface with the bottom dielectric, and wherein an energy gap of the middle dielectric layer decreases from (i) maximum energy gaps near the top and bottom surfaces of the middle dielectric laver, toward (ii) a middle of the middle dielectric layer.

* * * * *